United States Patent
Chiu et al.

(10) Patent No.: US 11,044,835 B2
(45) Date of Patent: *Jun. 22, 2021

(54) COOLING ELECTRONIC DEVICES IN A DATA CENTER

(71) Applicant: Google LLC, Mountain View, CA (US)

(72) Inventors: Jerry Chiu, Pacifica, CA (US); Gregory P. Imwalle, Mountain View, CA (US); Emad Samadiani, Mountain View, CA (US)

(73) Assignee: Google LLC, Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/706,247

(22) Filed: Dec. 6, 2019

(65) Prior Publication Data

US 2020/0315069 A1 Oct. 1, 2020

Related U.S. Application Data

(60) Provisional application No. 62/824,454, filed on Mar. 27, 2019.

(51) Int. Cl.
*H05K 7/20* (2006.01)

(52) U.S. Cl.
CPC ..... *H05K 7/20809* (2013.01); *H05K 7/20254* (2013.01); *H05K 7/20509* (2013.01); *H05K 7/20818* (2013.01)

(58) Field of Classification Search
CPC .......... H05K 7/20809; H05K 7/20818; H05K 7/20254; H05K 7/20509
See application file for complete search history.

(56) References Cited

U.S. PATENT DOCUMENTS

| 4,012,770 A | * | 3/1977 | Pravda | H01L 23/367 |
| | | | | 257/715 |
| 7,796,389 B2 | * | 9/2010 | Edmunds | H01L 23/427 |
| | | | | 361/700 |

(Continued)

FOREIGN PATENT DOCUMENTS

| TW | 201115102 | 5/2011 |
| TW | 201414145 | 4/2014 |

OTHER PUBLICATIONS

TW Office Action in Taiwan Application No. 108140369, dated Jun. 16, 2020, 27 pages (with English translation).

(Continued)

*Primary Examiner* — Jacob R Crum
(74) *Attorney, Agent, or Firm* — Fish & Richardson P.C.

(57) ABSTRACT

A server tray package includes a motherboard assembly that includes a plurality of data center electronic devices, the plurality of data center electronic devices including at least one heat generating processor device; a vapor chamber mounted on and in conductive thermal contact with the at least one heat generating processor device, the vapor chamber including a housing that defines an inner volume and encloses a working fluid; and a liquid cold plate assembly that includes a top portion mounted to at least one of the vapor chamber or the motherboard assembly and including a heat transfer member that includes an inlet port and an outlet port that are in fluid communication with a cooling liquid flow path defined through the heat transfer member and formed on a top surface of the housing of the vapor chamber.

22 Claims, 5 Drawing Sheets

(56) References Cited

U.S. PATENT DOCUMENTS

| | | | |
|---|---|---|---|
| 2004/0016534 A1* | 1/2004 | Lai | H01L 23/4006 165/104.26 |
| 2005/0280162 A1* | 12/2005 | Mok | H01L 23/427 257/778 |
| 2008/0144319 A1* | 6/2008 | Chang | F21V 29/763 362/294 |
| 2009/0159243 A1* | 6/2009 | Zhao | F28D 15/046 165/104.26 |
| 2010/0175856 A1* | 7/2010 | Meyer, IV | F28D 15/046 165/104.26 |
| 2011/0108245 A1* | 5/2011 | Tan | F28D 15/04 165/104.26 |
| 2012/0043060 A1* | 2/2012 | Wang | F28D 15/0266 165/104.26 |
| 2013/0025829 A1* | 1/2013 | Huang | F28D 15/0233 165/104.26 |
| 2014/0268548 A1* | 9/2014 | Rice | H05K 7/20336 361/679.47 |
| 2016/0262288 A1 | 9/2016 | Chainer et al. | |
| 2018/0153030 A1* | 5/2018 | Viswanathan | H05K 3/32 |
| 2019/0021188 A1* | 1/2019 | Phan | H05K 7/20336 |
| 2019/0103290 A1* | 4/2019 | Medina | H05K 7/20309 |
| 2019/0348345 A1* | 11/2019 | Parida | H01L 21/4882 |

OTHER PUBLICATIONS

International Search Report and Written Opinion in International Application No. PCT/US2019/058351, dated Jan. 27, 2020, 13 pages.

* cited by examiner

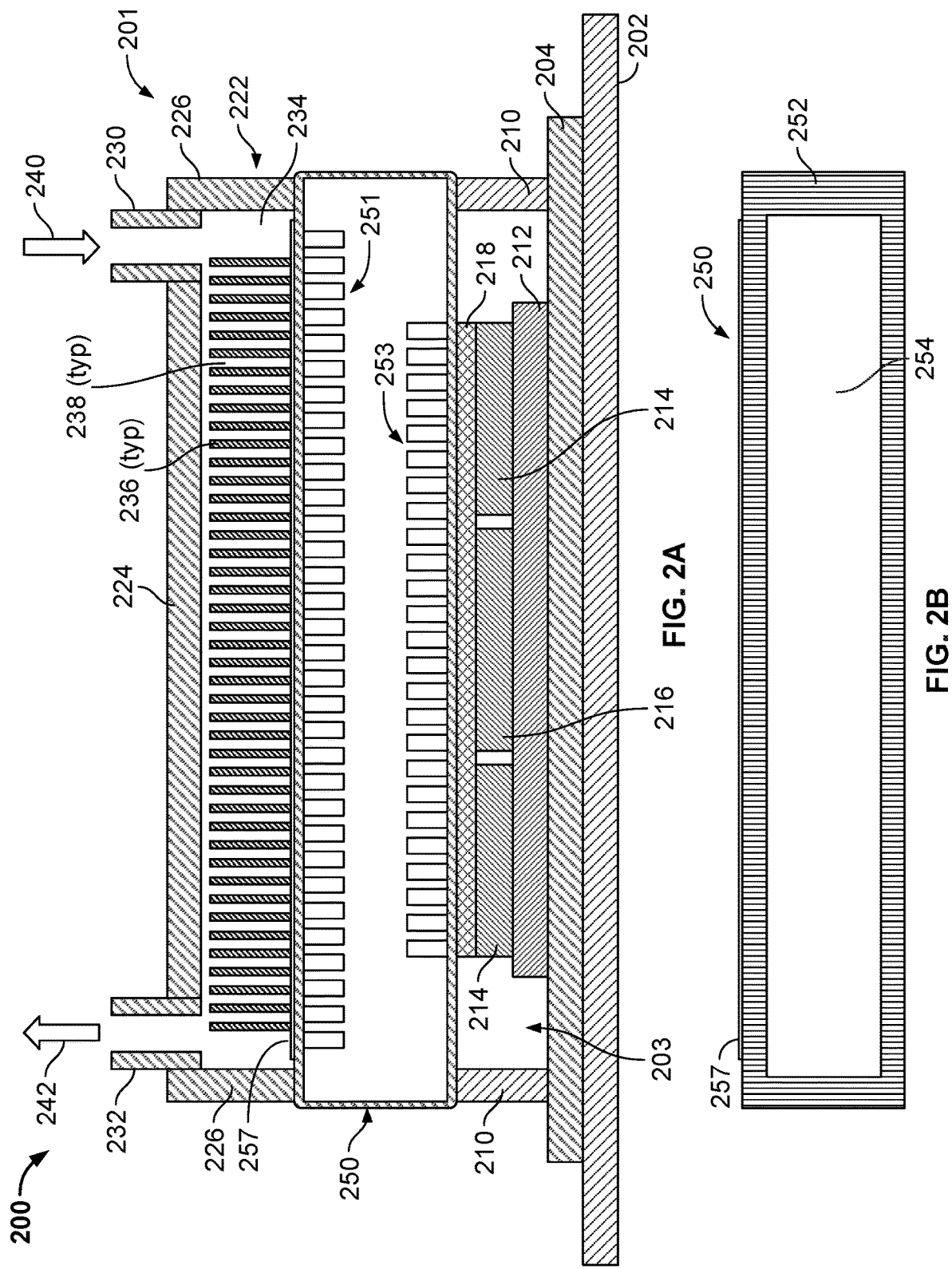

COOLING ELECTRONIC DEVICES IN A DATA CENTER

CROSS-REFERENCE TO RELATED APPLICATION

This application claims priority under 35 U.S.C. § 119 to U.S. Provisional Patent Application Ser. No. 62/824,454, filed on Mar. 27, 2019, the entire contents of which are incorporated by reference herein.

TECHNICAL FIELD

This document relates to systems and methods for providing cooling to electronic equipment, such as computer server racks and related equipment in computer data centers, with a liquid cooled cold plate and a vapor chamber.

BACKGROUND

Computer users often focus on the speed of computer microprocessors (e.g., megahertz and gigahertz). Many forget that this speed often comes with a cost—higher power consumption. This power consumption also generates heat. That is because, by simple laws of physics, all the power has to go somewhere, and that somewhere is, in the end, conversion into heat. A pair of microprocessors mounted on a single motherboard can draw hundreds of watts or more of power. Multiply that figure by several thousand (or tens of thousands) to account for the many computers in a large data center, and one can readily appreciate the amount of heat that can be generated. The effects of power consumed by the critical load in the data center are often compounded when one incorporates all of the ancillary equipment required to support the critical load.

Many techniques may be used to cool electronic devices (e.g., processors, memories, networking devices, and other heat generating devices) that are located on a server or network rack tray. For instance, forced convection may be created by providing a cooling airflow over the devices. Fans located near the devices, fans located in computer server rooms, and/or fans located in ductwork in fluid communication with the air surrounding the electronic devices, may force the cooling airflow over the tray containing the devices. In some instances, one or more components or devices on a server tray may be located in a difficult-to-cool area of the tray; for example, an area where forced convection is not particularly effective or not available.

The consequence of inadequate and/or insufficient cooling may be the failure of one or more electronic devices on the tray due to a temperature of the device exceeding a maximum rated temperature. While certain redundancies may be built into a computer data center, a server rack, and even individual trays, the failure of devices due to overheating can come at a great cost in terms of speed, efficiency, and expense.

SUMMARY

This disclosure describes a cooling system, for example, for rack mounted electronic devices (e.g., servers, processors, memory, networking devices or otherwise) in a data center. In various disclosed implementations, the cooling system may be or include a liquid cold plate assembly that is part of or integrated with a server tray package. In some implementations, the liquid cold plate assembly includes a base portion and a top portion that, in combination, form a cooling liquid flow path through which a cooling liquid is circulated and a thermal interface between one or more heat generating devices and the cooling liquid.

In an example implementation, a server tray package includes a motherboard assembly that includes a plurality of data center electronic devices, the plurality of data center electronic devices including at least one heat generating processor device; a vapor chamber mounted on and in conductive thermal contact with the at least one heat generating processor device, the vapor chamber including a housing that defines an inner volume and encloses a working fluid; and a liquid cold plate assembly that includes a top portion mounted to at least one of the vapor chamber or the motherboard assembly and including a heat transfer member that includes an inlet port and an outlet port that are in fluid communication with a cooling liquid flow path defined through the heat transfer member and formed on a top surface of the housing of the vapor chamber.

In an aspect combinable with the example implementation further includes a thermal interface material positioned between a bottom surface of the vapor chamber and at least a portion of the plurality of data center electronic devices.

In another aspect combinable with any one of the previous aspects, the liquid cold plate assembly further includes a plurality of heat transfer surfaces enclosed within the cooling liquid flow path and mounted to the top surface of the housing of the vapor chamber.

In another aspect combinable with any one of the previous aspects, the vapor chamber includes a plurality of fluidly independent chambers within the housing, each of the fluidly independent chambers enclosing at least a portion of the heat transfer fluid.

In another aspect combinable with any one of the previous aspects, the portions of the heat transfer fluid vary in at least one of composition or amount.

In another aspect combinable with any one of the previous aspects, at least one of the fluidly independent chambers includes a first volume, and at least another of the fluidly independent chambers includes a second volume greater than the first volume.

In another aspect combinable with any one of the previous aspects, the second volume is positioned in vertical alignment above the heat generating processor device.

In another aspect combinable with any one of the previous aspects, the vapor chamber includes a plurality of fins positioned in a bottom half of the inner volume.

In another aspect combinable with any one of the previous aspects, the vapor chamber includes a plurality of wicking structures positioned in a top half of the inner volume.

In another aspect combinable with any one of the previous aspects, the vapor chamber includes a heat transfer layer positioned on top of the housing and within the cooling liquid flow path.

In another example implementation, a method for cooling heat generating devices in a data center circulating a flow of a cooling liquid to a server tray package that includes a motherboard assembly that includes a plurality of data center electronic devices, the plurality of data center electronic devices including at least one heat generating processor device; a vapor chamber positioned between the base portion and the top portion; and a liquid cold plate assembly that includes a top portion mounted at least one of the vapor chamber or the motherboard assembly. The method further includes circulating a flow of a cooling liquid into an inlet port of the heat transfer member; receiving heat from the plurality of data center electronic devices into a heat transfer fluid enclosed within a housing of the vapor chamber to vaporize at least a portion of the heat transfer fluid; circulating the flow of the cooling liquid from the inlet port through a cooling liquid flow path defined through the heat transfer member and formed on a top surface of the housing of the vapor chamber to transfer heat from the vaporized portion of the heat transfer fluid into the cooling liquid; and circulating the heated flow of the cooling liquid from the cooling liquid flow path to an outlet port of the heat transfer member.

Another aspect combinable with the examiner implementation further includes transferring the heat from the plurality of data center electronic devices through a thermal interface material positioned between the plurality of data center electronic devices and a bottom surface of the housing of the vapor chamber.

In another aspect combinable with any one of the previous aspects, circulating the flow of the cooling liquid through the cooling liquid flow path defined through the heat transfer member includes circulating the cooling liquid through a plurality of flow channels defined by a plurality of heat transfer surfaces enclosed within the cooling liquid flow path and formed on the top surface of the vapor chamber.

In another aspect combinable with any one of the previous aspects, receiving heat from the plurality of data center electronic devices into the heat transfer fluid enclosed within the housing of the vapor chamber to vaporize at least the portion of the heat transfer fluid includes receiving heat from the plurality of data center electronic devices into a plurality of portions of the heat transfer fluid enclosed within respective fluidly independent chambers within the housing of the vapor chamber.

In another aspect combinable with any one of the previous aspects, the portions of the heat transfer fluid vary in at least one of composition or amount.

In another aspect combinable with any one of the previous aspects, at least one of the fluidly independent chambers includes a first volume, and at least another of the fluidly independent chambers includes a second volume greater than the first volume.

Another aspect combinable with any one of the previous aspects further includes receiving heat from the heat generating processor device into the portion of the heat transfer fluid enclosed within the second volume in the another of the fluidly independent chambers; and receiving heat from one or more memory devices into the portion of the heat transfer fluid enclosed within the first volume in the at least one of the fluidly independent chambers.

Another aspect combinable with any one of the previous aspects further includes transferring heat from the plurality of data center electronic devices, to a plurality of fins positioned in a bottom half of the inner volume, and into the heat transfer fluid.

Another aspect combinable with any one of the previous aspects further includes transferring heat from the vaporized heat transfer fluid, to a plurality of wicking structures positioned in a top half of the inner volume, and into the cooling liquid circulating through the cooling liquid flow path.

Another aspect combinable with any one of the previous aspects further includes transferring heat from the plurality of wicking structures through a heat transfer layer positioned on top of the housing and within the cooling liquid flow path and to the cooling liquid circulating through the cooling liquid flow path.

Various implementations of a data center cooling system according to the present disclosure may include one, some, or all of the following features. For example, a server tray package according to the present disclosure may provide for direct liquid cooling to high heat generating electronic devices in a data center. As another example, a server tray package according to the present disclosure may provide for multiple functionality including cooling, mechanical rigidity, and liquid coolant sealing. As another example, a server tray package according to the present disclosure may provide for custom cooling liquid flow paths and flow geometries to cool both high and low heat generating electronic devices mounted on a single substrate. As yet another example, a server tray package according to the present disclosure may allow for the cooling of heat-generating devices mounted on a substrate that have different heights (and different power usages). As a further example, a server tray package according to the present disclosure may allow for hot spot spreading in combination with high performance liquid cooling via cold plates. As yet another example, a server tray package according to the present disclosure may include one or more vapor chambers that can be tuned for cooling individual heat sources based on temperature and power requirements. As another example, a server tray package according to the present disclosure may allow for higher power computing components (e.g., processors) to be cooled by direct conductive contact with a liquid cooled cold plate for better performance. As a further example, a server tray package according to the present disclosure may include an aperture to allow for the integration of a liquid cooled cold plate with less potential warpage, but with protection for the server package electronic devices. As yet another example, a server tray package according to the present disclosure may include a seating surface for the liquid cooled cold plate and prevent tilt of the plate. As another example, a server tray package according to the present disclosure may provide for more direct heat transfer through conductive contact between a heat generating device (such as a processor) while still providing cooling to devices that generate less heat, such as memory modules.

The details of one or more embodiments are set forth in the accompanying drawings and the description below. Other features, objects, and advantages will be apparent from the description and drawings, and from the claims.

DESCRIPTION OF DRAWINGS

FIG. 2A illustrates a schematic cross-sectional side view of another example implementation of a server tray package that includes a liquid cold plate assembly and a vapor chamber.

FIG. 2B illustrates a schematic cross-sectional side view of an example implementation of a vapor chamber that can be used in a liquid cold plate assembly in a server tray package.

DETAILED DESCRIPTION

In some example implementations, a cooling system, for example, for rack mounted electronic devices (e.g., servers, processors, memory, networking devices or otherwise) in a data center is disclosed. In various disclosed implementations, the cooling system may be or include a vapor chamber and a liquid cold plate assembly that is part of or integrated with a server tray package. In some implementations, the liquid cold plate assembly includes a cooling liquid flow path through which a cooling liquid is circulated in conductive and convective thermal contact with the vapor chamber. In some implementations, a bottom surface or channel of the cooling liquid flow path is formed on or part of a top surface of a housing of the vapor chamber.

Figure 1:
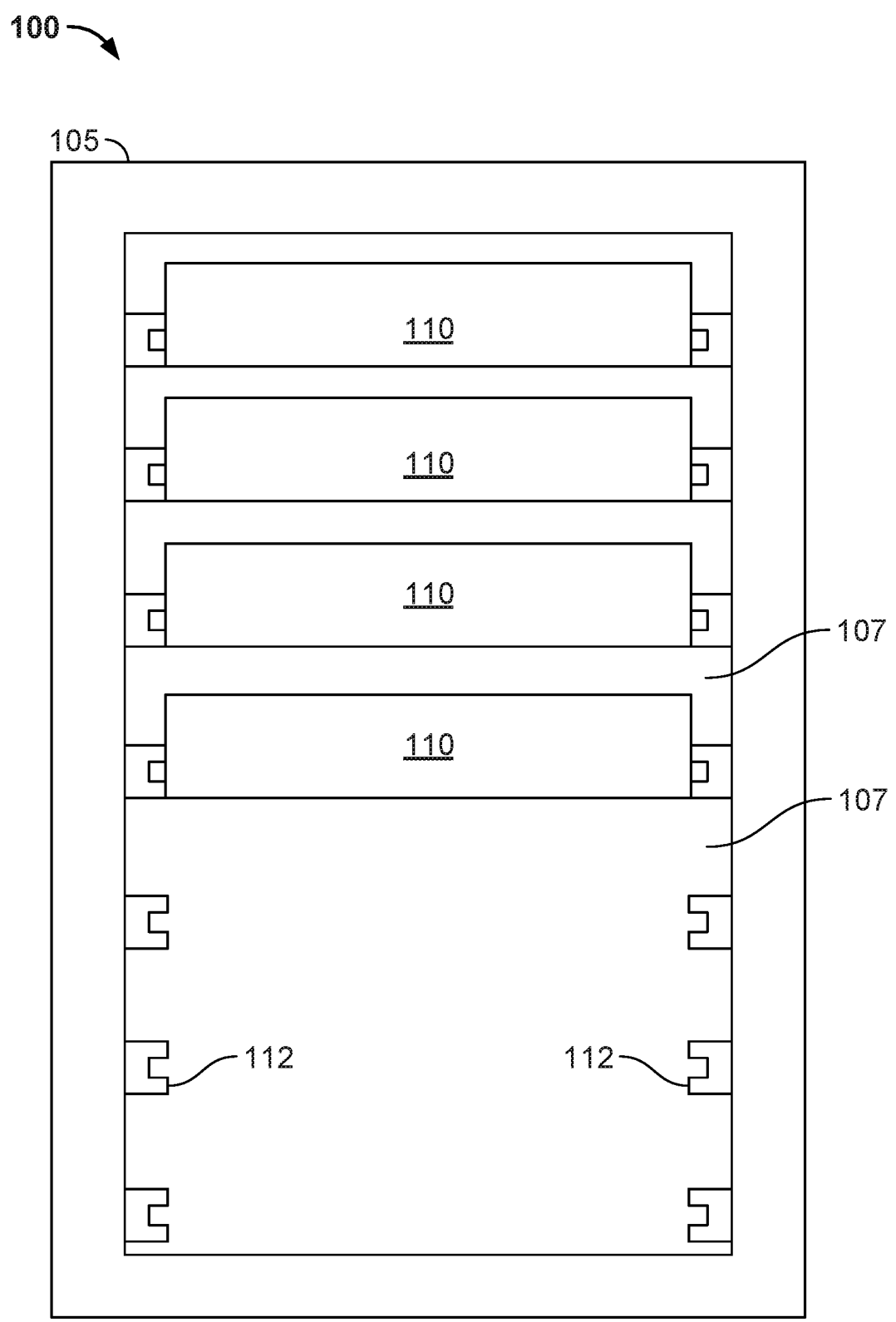
FIG. 1 illustrates a front view of a server rack and server rack sub-assemblies configured to mount within a rack used in a data center environment.

FIG. 1 illustrates an example system 100 that includes a server rack 105, e.g., a 13 inch or 19 inch server rack, and multiple server rack sub-assemblies 110 mounted within the rack 105. Although a single server rack 105 is illustrated, server rack 105 may be one of a number of server racks within the system 100, which may include a server farm or a co-location facility that contains various rack mounted computer systems. Also, although multiple server rack sub-assemblies 110 are illustrated as mounted within the rack 105, there might be only a single server rack sub-assembly. Generally, the server rack 105 defines multiple slots 107 that are arranged in an orderly and repeating fashion within the server rack 105, and each slot 107 is a space in the rack into which a corresponding server rack sub-assembly 110 can be placed and removed. For example, the server rack sub-assembly can be supported on rails 112 that project from opposite sides of the rack 105, and which can define the position of the slots 107.

The slots 107, and the server rack sub-assemblies 110, can be oriented with the illustrated horizontal arrangement (with respect to gravity). Alternatively, the slots 107, and the server rack sub-assemblies 110, can be oriented vertically (with respect to gravity). Where the slots are oriented horizontally, they may be stacked vertically in the rack 105, and where the slots are oriented vertically, they may be stacked horizontally in the rack 105.

Server rack 105, as part of a larger data center for instance, may provide data processing and storage capacity. In operation, a data center may be connected to a network, and may receive and respond to various requests from the network to retrieve, process, and/or store data. In operation, for example, the server rack 105 typically facilitates the communication of information over a network with user interfaces generated by web browser applications of users who request services provided by applications running on computers in the datacenter. For example, the server rack 105 may provide or help provide a user who is using a web browser to access web sites on the Internet or the World Wide Web.

The server rack sub-assembly 110 may be one of a variety of structures that can be mounted in a server rack. For example, in some implementations, the server rack sub-assembly 110 may be a "tray" or tray assembly that can be slidably inserted into the server rack 105. The term "tray" is not limited to any particular arrangement, but instead applies to the motherboard or other relatively flat structures appurtenant to a motherboard for supporting the motherboard in position in a rack structure. In some implementations, the server rack sub-assembly 110 may be a server tray package, server chassis, or server container (e.g., server box). In some implementations, the server rack sub-assembly 110 may be a hard drive cage.

FIG. 2A illustrates a schematic cross-sectional side view of an example implementation of a server tray package 200 that includes a liquid cold plate assembly 201 and a vapor chamber 250. In some implementations, the server tray package 200 may be used as one or more of the server rack sub-assemblies 110 shown in FIG. 1. Referring to FIG. 2A, the server tray package 200 includes a printed circuit board 202, e.g., motherboard 202, that supports one or more data center electronic devices; in this example, two or more memory modules 214 and one or more processing devices 216 (e.g., one or more application-specific integrated circuits (ASIC)). In some aspects, the motherboard 202 may be mounted on a frame (not shown), which can include or simply be a flat structure that can be grasped by technicians for moving the motherboard 202 into place and holding it in position within the rack 105. For example, the server tray package 200 may be mounted horizontally in the server rack 105 such as by sliding the frame into the slot 107 and over a pair of rails in the rack 105 on opposed sides of the server tray package 200—much like sliding a lunch tray into a cafeteria rack. The frame can extend below the motherboard 202 or can have other forms (e.g., by implementing it as a peripheral frame around the motherboard 202) or may be eliminated so that the motherboard itself is located in, e.g., slidably engages, the rack 105. The frame can be a flat plate or include one or more side walls that project upwardly from the edges of the flat plate, and the flat plate could be the floor of a closed-top or open-top box or cage.

In some examples, one motherboard 202 is mounted on a frame; alternatively, multiple motherboards 202 may be mounted on a frame, depending on the needs of the particular application. In some implementations, the one or more fans (not shown) can be placed on the motherboard 202 or a frame so that air enters at the front edge of the server tray package 200, closer to the front of the rack 105 when the server tray package 200 is installed in the rack 105, flows over the motherboard 202, over some of the data center electronic components on the motherboard 202, and is exhausted from the server tray package 200 at the back edge, closer to the back of the rack 105 when the server tray package 200 is installed in the rack 105. The one or more fans can be secured to the motherboard 202 or a frame by brackets.

As illustrated, a substrate 204 and an interposer 212 (e.g., a silicon interposer) are positioned between the data center electronic devices 214 and 216 and the motherboard 202. The substrate 204, for example, provides an interface between one or more of the data center electronic devices (e.g., the processing device 216) and the motherboard 202, such as through pins that provide electrical and communication interfaces. The substrate 204 also, in this example, may provide a mounting location for one or more components of the liquid cold plate assembly 201. The interposer 212, for example, provides a high bandwidth connection between the data center electronic devices, such as between the memory modules 214 and the processing device 216.

As shown in FIG. 2A, the liquid cold plate assembly 201 includes a top portion 222, also referred to as a top hat 222. Sides 210 define or enclose a volume 203 in which the interposer 212 and the data center electronic devices 214 and 216 (mounted thereon) are positioned in the server tray package 200. As shown in this example, a thermal interface material 218 (e.g., a phase change material or otherwise thermally conductive material) is contactingly positioned between a bottom side of a vapor chamber 250 and the data center electronic devices 214 and 216 to provide a conductive heat transfer interface between these components.

The top hat 222, as shown, includes a cap 224 that is connected to the sides 226. In combination, the cap 224 and sides 226 along with a top surface of the vapor chamber 250 define a volume 234 through which a flow of a cooling liquid may be circulated. As shown in this example, the cap 224 includes a cooling liquid inlet 230 through which a supply 240 of cooling liquid may enter. The cap 224 also includes a cooling liquid outlet 232 through which a return 242 of cooling liquid may exit. The volume 234 defines or includes a cooling liquid flow path between the inlet 230 and the outlet 232. As shown in this example, one or more heat transfer surfaces 236 (e.g., fins, undulations, ridges, or other extended surfaces that increase a heat transfer area) are positioned on a top surface of the vapor chamber 250 in the volume 234. The heat transfer surfaces 236 define channels 238, for example, through which the cooling liquid may be circulated to increase an amount of heat transferred from the data center electronic devices 214 and 216 to the cooling liquid (e.g., relative to an amount transferred in an implementation of the server tray package 200 that does not include the heat transfer surfaces 236). Alternative implementations of the server tray package 200 may include multiple inlets 230, multiple outlets 232, or may not include the heat transfer surfaces 236. Also, alternative implementations may have the inlet 230, outlet 232, or both, positioned on the sides 226 of the top hat 222.

In this example implementation, the sides 226 of the top hat 222 (which may comprise a side housing) are mounted to the vapor chamber 250. As shown in FIGS. 2A-2B, the vapor chamber 250 includes a housing that contains a heat transfer fluid 254 (e.g., water, refrigerant, or other fluid that boils in response to heat being received). In this example, the vapor chamber 250 includes a single chamber within the housing 252 that encloses the fluid 254. In some aspects, the vapor chamber 250 may include boiling enhancements 253 (e.g., fins or otherwise) within the chamber (e.g., on a bottom inner surface) to increase heat transfer to the fluid 254. The vapor chamber 250 may also include condensing enhancements 251 (e.g., a wicking structure) within the chamber (e.g., on a top inner surface) to allow for better heat transfer from the fluid 254 to the top hat 222 (shown in FIG. 2A but not in FIG. 2B for simplicity).

As shown in this example, the vapor chamber 250 (with a single chamber and fluid 254) sits on top of the data center electronic devices 214 and 216. In some aspects, one or more of the electronic devices (e.g., processor 216) may generate more heat than the other electronic devices (e.g., memory modules 214). Thus, the vapor chamber 250 may eliminate or help eliminate hot spots caused by the processor 216 by distributing the heat from the processor 216 throughout the chamber 250 (e.g., into the fluid 254). Thus, while there may be an uneven (per unit area) transfer of heat from the data center electronic devices 214 and 216 to the vapor chamber, an even or substantially even (per unit area) transfer of heat from the vapor chamber 250 to the top hat assembly 222. The vapor chamber 250 is mounted to form the bottom of the cooling liquid flow path in the top hat 222 of the liquid cold plate assembly 201. In some implementations, a heat transfer surface 257 is also formed on the top of the vapor chamber 250. The heat transfer surface 257 may be a layer of copper or other heat conductive material. In some aspects, the heat transfer surfaces 236 sit on top or are formed on top of the heat transfer layer 257.

In an example operation of the server tray package 200 to cool the data center electronic devices 214 and 216, the server tray package 200 may be deployed, for example, in a data center server rack 105 in a data center. During operation of the server tray package 200, the processing device 216 and memory modules 214 generate heat that may need to be dissipated or removed from the server tray package 200 (e.g., for proper operation of the server tray package 200). Heat generated by the processing device 216 and memory modules 214 is transferred through the thermal interface material 218 and to the vapor chamber 250. As heat is transferred into the fluid 254, the fluid 254 may boil or vaporize. The boiling or vaporized fluid 254 naturally circulates toward a top of the vapor chamber 250, where heat is transferred to into the cooling liquid 240 in the cooling liquid flow path of the volume 234. In some aspects, heat is transferred through the heat transfer layer 257 and enhanced by the heat transfer surfaces 236 to the cooling liquid 240. As heat is transferred to the cooling liquid supply 240, the vaporized or boiled fluid 254 condenses back into liquid form and falls back to the bottom of the vapor chamber 250.

The heat transferred to the cooling liquid flow path of the top hat 222 is transferred to the supply 240 of the cooling liquid that is circulated through the inlet 230 and into the volume 234 of the top hat 222. In some examples, the cooling liquid may be a chilled water or glycol, such as from one or more chillers fluidly coupled to the server tray package 200. In alternative examples, the cooling liquid may be a condenser water or other evaporatively-cooled liquid (e.g., without mechanical refrigeration). In other examples, the cooling liquid may be a dielectric single or two-phase fluid. In any event, the cooling liquid supply 240 may be at an appropriate temperature and flow rate to remove a desired amount of heat from the data center electronic devices 214 and 216. In some aspects, the transfer of heat to the vapor chamber 250 (e.g., from devices 214 and 216) is enhanced by the fins 253. In some aspects, the transfer of heat from the vapor chamber 250 to the volume 234 is enhanced by the wicking structures 251.

In some examples, heat is transferred directly from the vapor chamber 250 to the cooling liquid supply 240. Heat may also be transferred from the vapor chamber 250, through one or more heat transfer surfaces 236, and then to the cooling liquid supply 240 that flows through channels 238. Heat may also be transferred from the vapor chamber 250, through the heat transfer layer 257, through one or more heat transfer surfaces 236, and then to the cooling liquid supply 240 that flows through channels 238. The heated cooling liquid supply 240 is circulated to the outlet 232 and exits the top hat 222 as the cooling liquid return 242 (e.g., that is at a higher temperature than the cooling liquid supply 240). The cooling liquid return 242 is circulated back, e.g., to a source of the cooling liquid, to expel the heat (e.g., in a chiller, cooling tower, or other heat exchanger) from the return 242.

Figure 2C:
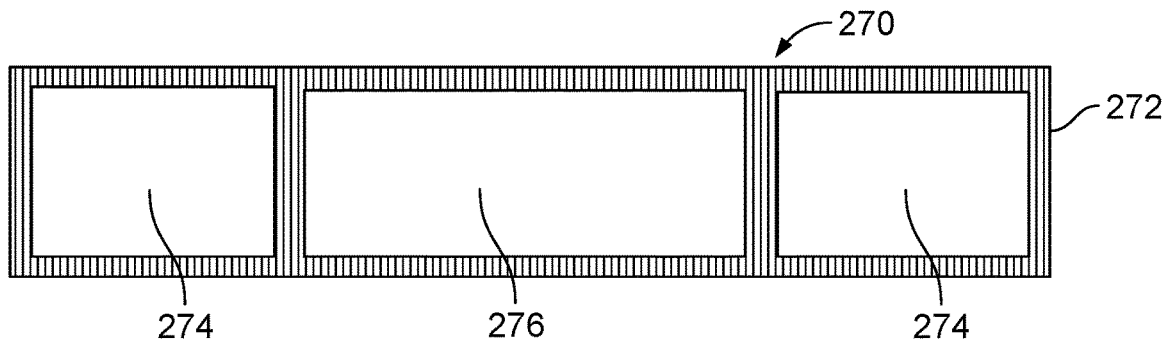
FIGS. 2C and 2D illustrate schematic side and top views of another example implementation of a vapor chamber that can be used in a liquid cold plate assembly in a server tray package.
Figure 2D:
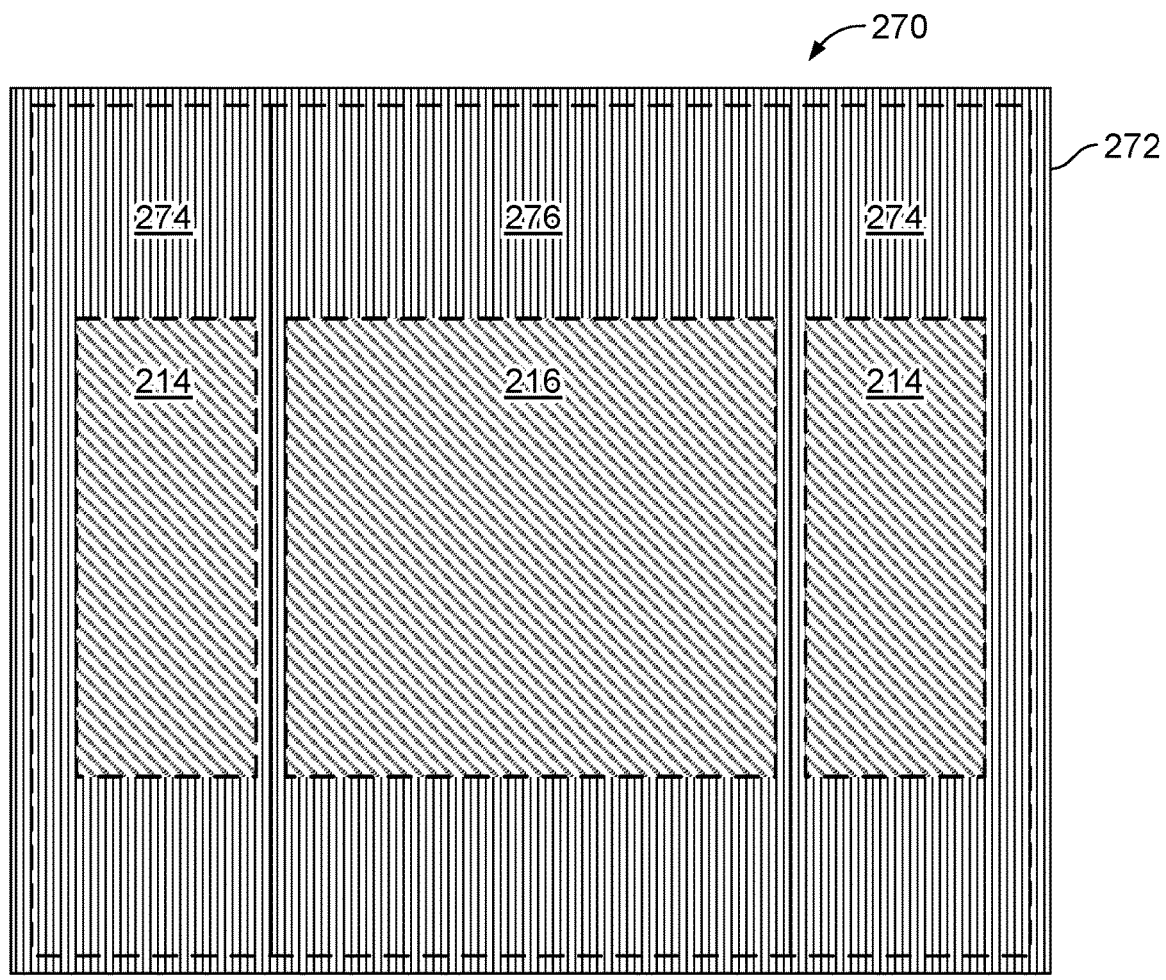

FIGS. 2C and 2D illustrate schematic side and top views of another example implementation of a vapor chamber 270 that can be used in a liquid cold plate assembly in a server tray package, such as the server tray package 200. As shown, vapor chamber 270 has multiple sub-chambers; in this example, three sub-chambers split between two sub-chambers 274 and a sub-chamber 276. Heat transfer fluid may be contained in each sub-chamber 274 and 276. As further illustrated, the sub-chambers 274 may be differently sized (e.g., length and width) than the sub-chamber 276. Although not shown, the vapor chamber 270 may include fins (such as fins 253) or wicking structures (such as wicking structures 251), or both, as does vapor chamber 250. Also, in some aspects, a heat transfer layer (such as layer 257) may be formed on top of or integral to the vapor chamber 270 just as the vapor chamber 250.

As shown in FIG. 2D, the larger, single sub-chamber 276 may sit, when the vapor chamber 270 is positioned on the sides 210 (shown in FIG. 2A), over the processor 216, while the two sub-chambers 274 may sit over the memory modules 214. In this example, each sub-chamber may be tailored, e.g., according to the heat power output of the particular data center electronic device over which it sits. For example, the type of heat transfer fluid contained in, or dimensions of, each sub-chamber can be tailored to meet the heat transfer requirements to remove heat from the particular data center electronic device.

Figure 3A:
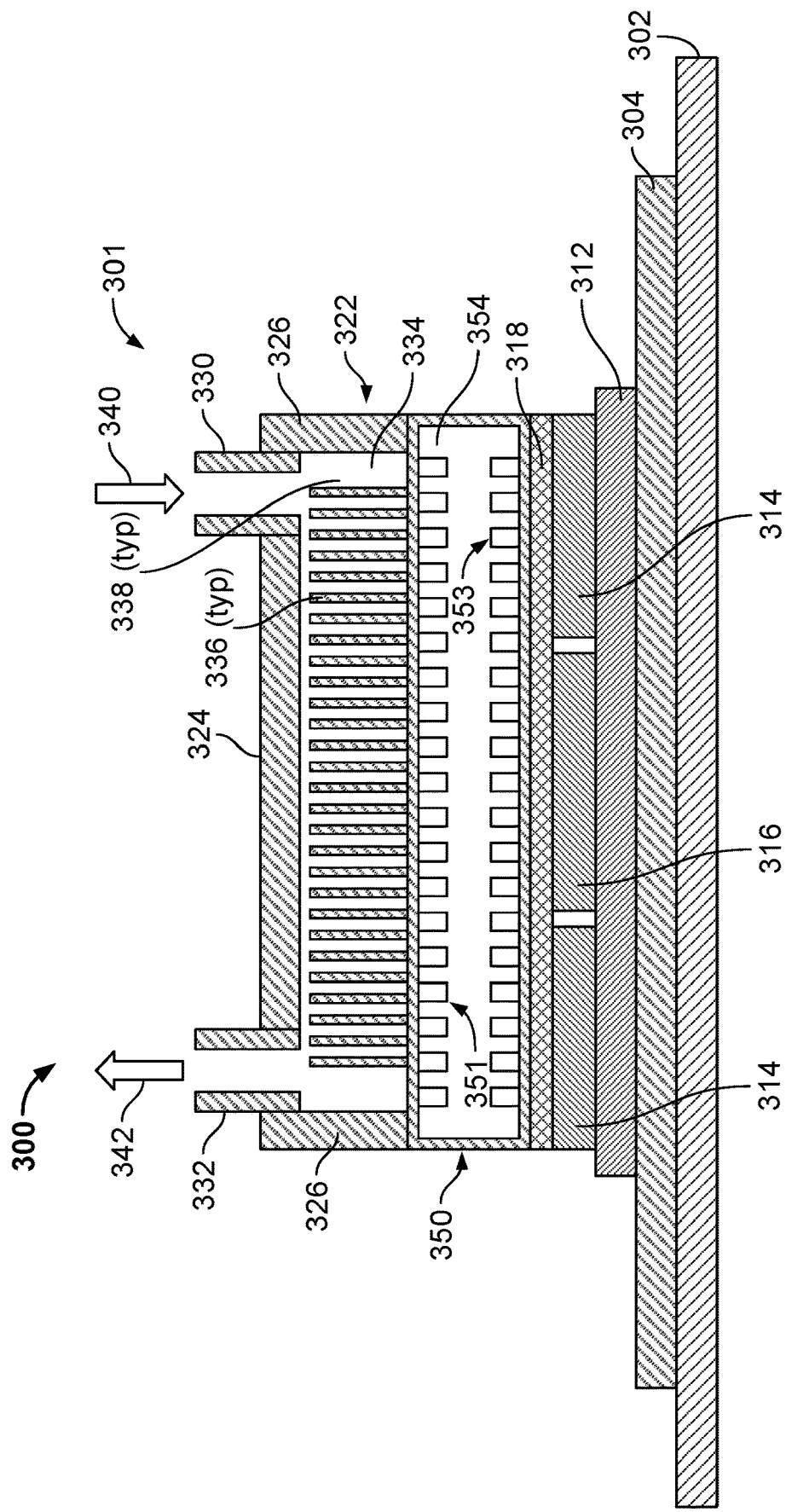
FIG. 3A illustrates a schematic cross-sectional side view of another example implementation of a server tray package that includes a liquid cold plate assembly and a vapor chamber.

FIG. 3A illustrates a schematic cross-sectional side view of an example implementation of a server tray package 300 that includes a liquid cold plate assembly 301 and a vapor chamber 350. In some implementations, the server tray package 300 may be used as one or more of the server rack sub-assemblies 110 shown in FIG. 1. In some aspects, the liquid cold plate assembly 301 and vapor chamber 350 may be substantially similar to the assembly 201 and vapor chamber 250, respectively, however, the dimensions (e.g., width as shown in FIG. 3A) of the liquid cold plate assembly 301 and vapor chamber 350 may match a width of a thermal interface material positioned between the vapor chamber 350 and one or more heat generating devices 314 and 316.

Referring to FIG. 3A, the server tray package 300 includes a printed circuit board 302, e.g., motherboard 302, that supports one or more data center electronic devices; in this example, two or more memory modules 314 and one or more processing devices 316 (e.g., one or more application-specific integrated circuits (ASIC)). In some aspects, the motherboard 302 may be mounted on a frame (not shown), which can include or simply be a flat structure that can be grasped by technicians for moving the motherboard 302 into place and holding it in position within the rack 105. For example, the server tray package 300 may be mounted horizontally in the server rack 105 such as by sliding the frame into the slot 107 and over a pair of rails in the rack 105 on opposed sides of the server tray package 300—much like sliding a lunch tray into a cafeteria rack. The frame can extend below the motherboard 302 or can have other forms (e.g., by implementing it as a peripheral frame around the motherboard 302) or may be eliminated so that the motherboard itself is located in, e.g., slidably engages, the rack 105. The frame can be a flat plate or include one or more side walls that project upwardly from the edges of the flat plate, and the flat plate could be the floor of a closed-top or open-top box or cage.

In some examples, one motherboard 302 is mounted on a frame; alternatively, multiple motherboards 302 may be mounted on a frame, depending on the needs of the particular application. In some implementations, the one or more fans (not shown) can be placed on the motherboard 302 or a frame so that air enters at the front edge of the server tray package 300, closer to the front of the rack 105 when the server tray package 300 is installed in the rack 105, flows over the motherboard 302, over some of the data center electronic components on the motherboard 302, and is exhausted from the server tray package 300 at the back edge, closer to the back of the rack 105 when the server tray package 300 is installed in the rack 105. The one or more fans can be secured to the motherboard 302 or a frame by brackets.

As illustrated, a substrate 304 and an interposer 312 (e.g., a silicon interposer) are positioned between the data center electronic devices 314 and 316 and the motherboard 302. The substrate 304, for example, provides an interface between one or more of the data center electronic devices (e.g., the processing device 316) and the motherboard 302, such as through pins that provide electrical and communication interfaces. The substrate 304 also, in this example, may provide a mounting location for one or more components of the liquid cold plate assembly 301. The interposer 312, for example, provides a high bandwidth connection between the data center electronic devices, such as between the memory modules 314 and the processing device 316.

As shown in FIG. 3A, the liquid cold plate assembly 301 includes a top portion 322, also referred to as a top hat 322. As shown in this example, a thermal interface material 318 (e.g., a phase change material or otherwise thermally conductive material) is contactingly positioned between a bottom side of a vapor chamber 350 and the data center electronic devices 314 and 316 to provide a conductive heat transfer interface between these components.

The top hat 322, as shown, includes a cap 324 that is connected to the sides 326. In combination, the cap 324 and sides 326 along with a top surface of the vapor chamber 350 define a volume 334 through which a flow of a cooling liquid may be circulated. As shown in this example, the cap 324 includes a cooling liquid inlet 330 through which a supply 340 of cooling liquid may enter. The cap 324 also includes a cooling liquid outlet 332 through which a return 342 of cooling liquid may exit. The volume 334 defines or includes a cooling liquid flow path between the inlet 330 and the outlet 332. As shown in this example, one or more heat transfer surfaces 336 (e.g., fins, undulations, ridges, or other extended surfaces that increase a heat transfer area) are positioned on a top surface of the vapor chamber 350 in the volume 334. The heat transfer surfaces 336 define channels 338, for example, through which the cooling liquid may be circulated to increase an amount of heat transferred from the data center electronic devices 314 and 316 to the cooling liquid (e.g., relative to an amount transferred in an implementation of the server tray package 300 that does not include the heat transfer surfaces 336). Alternative implementations of the server tray package 300 may include multiple inlets 330, multiple outlets 332, or may not include the heat transfer surfaces 336. Also, alternative implementations may have the inlet 330, outlet 332, or both, positioned on the sides 326 of the top hat 322.

Figure 3B:
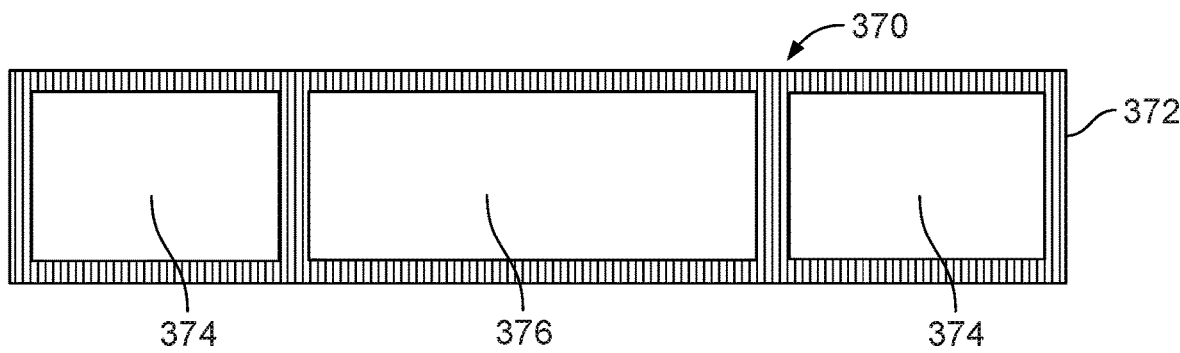
FIGS. 3B and 3C illustrate schematic side and top views of another example implementation of a vapor chamber that can be used in a liquid cold plate assembly in a server tray package.

In this example implementation, the sides 326 of the top hat 322 (which may comprise a side housing) are mounted to the vapor chamber 350. As shown in FIGS. 3A-3B, the vapor chamber 350 includes a housing that contains a heat transfer fluid 354 (e.g., water, refrigerant, or other fluid that boils in response to heat being received). In this example, the vapor chamber 350 includes a single chamber within the housing 352 that encloses the fluid 354. In some aspects, the vapor chamber 350 may include boiling enhancements 353 (e.g., fins or otherwise) within the chamber (e.g., on a bottom inner surface) to increase heat transfer to the fluid 354. The vapor chamber 350 may also include condensing enhancements 351 (e.g., a wicking structure) within the chamber (e.g., on a top inner surface) to allow for better heat transfer from the fluid 354 to the top hat 322.

As shown in this example, the vapor chamber 350 (with a single chamber and fluid 354) sits on top of the data center electronic devices 314 and 316. In some aspects, one or more of the electronic devices (e.g., processor 316) may generate more heat than the other electronic devices (e.g., memory modules 314). Thus, the vapor chamber 350 may eliminate or help eliminate hot spots caused by the processor 316 by distributing the heat from the processor 316 throughout the chamber 350 (e.g., into the fluid 354). Thus, while there may be an uneven (per unit area) transfer of heat from the data center electronic devices 314 and 316 to the vapor chamber, an even or substantially even (per unit area) transfer of heat from the vapor chamber 350 to the top hat assembly 322. The vapor chamber 350 is mounted to form the bottom of the cooling liquid flow path in the top hat 322 of the liquid cold plate assembly 301. In some implementations, a heat transfer surface 357 is also formed on the top of the vapor chamber 350. The heat transfer surface 357 may be a layer of copper or other heat conductive material. In some aspects, the heat transfer surfaces 336 sit on top or are formed on top of the heat transfer layer 357.

In an example operation of the server tray package 300 to cool the data center electronic devices 314 and 316, the server tray package 300 may be deployed, for example, in a data center server rack 105 in a data center. During operation of the server tray package 300, the processing device 316 and memory modules 314 generate heat that may need to be dissipated or removed from the server tray package 300 (e.g., for proper operation of the server tray package 300). Heat generated by the processing device 316 and memory modules 314 is transferred through the thermal interface material 318 and to the vapor chamber 350. As heat is transferred into the fluid 354, the fluid 354 may boil or vaporize. The boiling or vaporized fluid 354 naturally circulates toward a top of the vapor chamber 350, where heat is transferred to into the cooling liquid 340 in the cooling liquid flow path of the volume 334. In some aspects, heat is transferred through the heat transfer layer 357 and enhanced by the heat transfer surfaces 336 to the cooling liquid 340. As heat is transferred to the cooling liquid supply 340, the vaporized or boiled fluid 354 condenses back into liquid form and falls back to the bottom of the vapor chamber 350.

The heat transferred to the cooling liquid flow path of the top hat 322 is transferred to the supply 340 of the cooling liquid that is circulated through the inlet 330 and into the volume 334 of the top hat 322. In some examples, the cooling liquid may be a chilled water or glycol, such as from one or more chillers fluidly coupled to the server tray package 300. In alternative examples, the cooling liquid may be a condenser water or other evaporatively-cooled liquid (e.g., without mechanical refrigeration). In other examples, the cooling liquid may be a dielectric single or two-phase fluid. In any event, the cooling liquid supply 340 may be at an appropriate temperature and flow rate to remove a desired amount of heat from the data center electronic devices 314 and 316. In some aspects, the transfer of heat to the vapor chamber 350 (e.g., from devices 314 and 316) is enhanced by the fins 353. In some aspects, the transfer of heat from the vapor chamber 350 to the volume 334 is enhanced by the wicking structures 351.

In some examples, heat is transferred directly from the vapor chamber 350 to the cooling liquid supply 340. Heat may also be transferred from the vapor chamber 350, through one or more heat transfer surfaces 336, and then to the cooling liquid supply 340 that flows through channels 338. Heat may also be transferred from the vapor chamber 350, through the heat transfer layer 357, through one or more heat transfer surfaces 336, and then to the cooling liquid supply 340 that flows through channels 338. The heated cooling liquid supply 340 is circulated to the outlet 332 and exits the top hat 322 as the cooling liquid return 342 (e.g., that is at a higher temperature than the cooling liquid supply 340). The cooling liquid return 342 is circulated back, e.g., to a source of the cooling liquid, to expel the heat (e.g., in a chiller, cooling tower, or other heat exchanger) from the return 342.

Figure 3C:
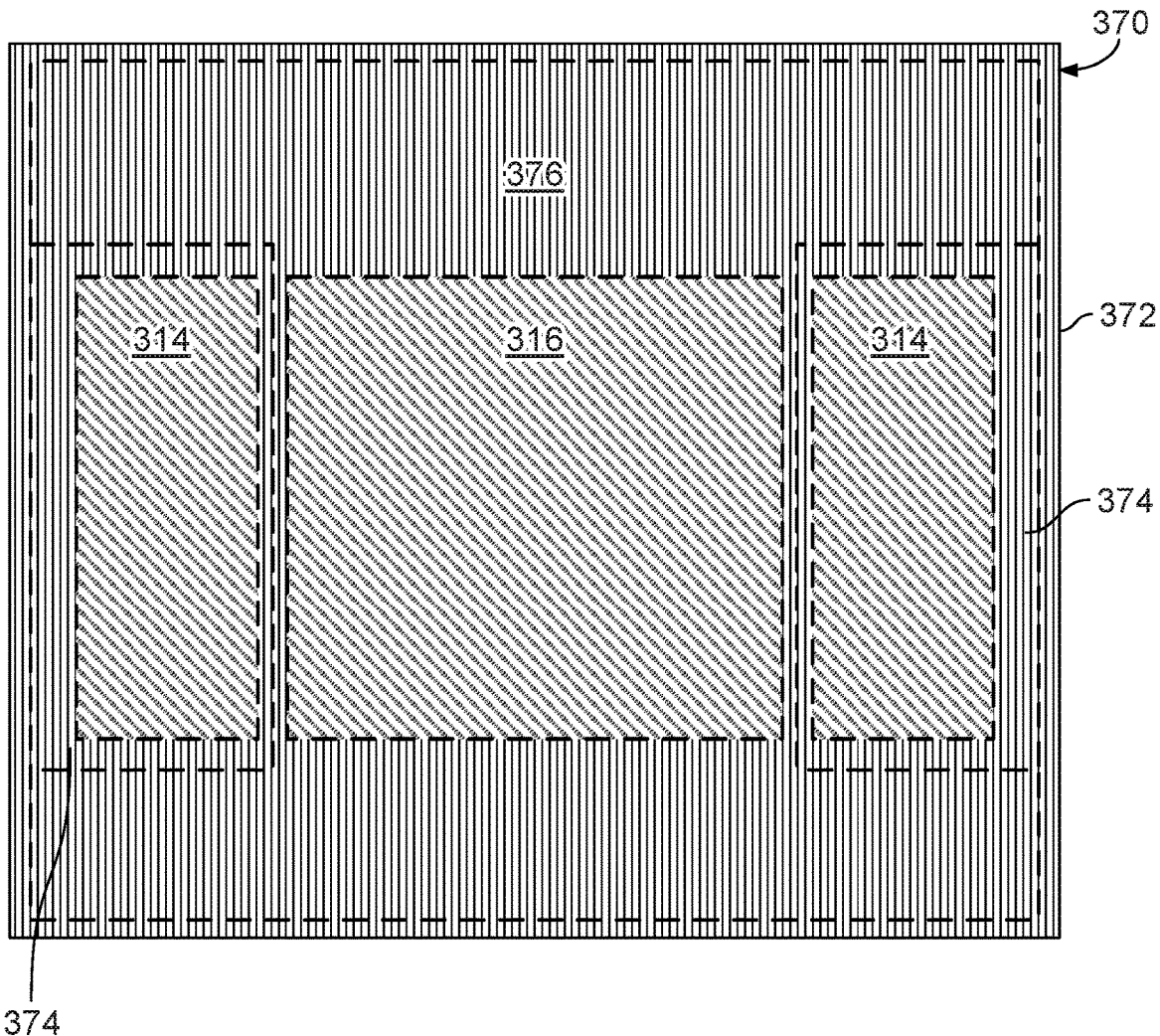

FIGS. 3B and 3C illustrate schematic side and top views of another example implementation of a vapor chamber 370 that can be used in a liquid cold plate assembly in a server tray package, such as the server tray package 300. As shown, vapor chamber 370 has multiple sub-chambers; in this example, three sub-chambers split between two sub-chambers 374 and a sub-chamber 376. Heat transfer fluid may be contained in each sub-chamber 374 and 376. As further illustrated, the sub-chambers 374 may be differently sized (e.g., length and width) than the sub-chamber 376. Although not shown, the vapor chamber 370 may include fins (such as fins 353) or wicking structures (such as wicking structures 351), or both, as does vapor chamber 350. Also, in some aspects, a heat transfer layer (such as layer 357) may be formed on top of or integral to the vapor chamber 370 just as the vapor chamber 350.

As shown in FIG. 3C, the larger, single sub-chamber 376 may sit, when the vapor chamber 370 is positioned on the sides 310 (shown in FIG. 3A), over the processor 316, while the two sub-chambers 374 may sit over the memory modules 314. In this example, each sub-chamber may be tailored, e.g., according to the heat power output of the particular data center electronic device over which it sits. For example, the type of heat transfer fluid contained in, or dimensions of, each sub-chamber can be tailored to meet the heat transfer requirements to remove heat from the particular data center electronic device.

A number of embodiments have been described. Nevertheless, it will be understood that various modifications may be made without departing from the spirit and scope of what is described. For example, the steps of example operations of example methods and processes described herein may be performed in other orders, some steps may be removed, and other steps may be added. Accordingly, other embodiments are within the scope of the following claims.

What is claimed is:
1. A server tray package, comprising:
a motherboard assembly that comprises a plurality of data center electronic devices, the plurality of data center electronic devices comprising at least one heat generating processor device;
a vapor chamber mounted on and in conductive thermal contact with the at least one heat generating processor device, the vapor chamber comprising a housing that defines an inner volume and encloses a working fluid; and
a liquid cold plate assembly that comprises a top portion mounted to at least one of the vapor chamber or the motherboard assembly and comprising a heat transfer member that comprises an inlet port and an outlet port that are in fluid communication with a cooling liquid flow path defined through the heat transfer member and formed on a top surface of the housing of the vapor chamber,
wherein the vapor chamber comprises a heat transfer layer positioned on top of the housing and within the cooling liquid flow path.
2. The server tray package of claim 1, further comprising a thermal interface material positioned between a bottom surface of the vapor chamber and at least a portion of the plurality of data center electronic devices.
3. The server tray package of claim 1, wherein the liquid cold plate assembly further comprises a plurality of heat transfer surfaces enclosed within the cooling liquid flow path and mounted to the top surface of the housing of the vapor chamber.

4. The server tray package of claim 1, wherein the vapor chamber comprises a plurality of fluidly independent chambers within the housing, each of the fluidly independent chambers enclosing at least a portion of the heat transfer fluid.

5. The server tray package of claim 4, wherein the portions of the heat transfer fluid vary in at least one of composition or amount.

6. The server tray package of claim 4, wherein at least one of the fluidly independent chambers comprises a first volume, and at least another of the fluidly independent chambers comprises a second volume greater than the first volume.

7. The server tray package of claim 6, wherein the second volume is positioned in vertical alignment above the heat generating processor device.

8. The server tray package of claim 1, wherein the vapor chamber comprises a plurality of fins positioned in a bottom half of the inner volume.

9. The server tray package of claim 1, wherein the vapor chamber comprises a plurality of wicking structures positioned in a top half of the inner volume.

10. A method for cooling heat generating devices in a data center, comprising:
    circulating a flow of a cooling liquid to a server tray package that comprises:
        a motherboard assembly that comprises a plurality of data center electronic devices, the plurality of data center electronic devices comprising at least one heat generating processor device;
        a liquid cold plate assembly that comprises a top portion; and
        a vapor chamber that forms a base portion of the liquid cold plate assembly, the top portion mounted to at least one of the vapor chamber or the motherboard assembly;
    circulating a flow of a cooling liquid into an inlet port of the heat transfer member;
    receiving heat from the plurality of data center electronic devices into a heat transfer fluid enclosed within a housing of the vapor chamber to vaporize at least a portion of the heat transfer fluid;
    transferring heat from the vaporized heat transfer fluid, to a plurality of wicking structures positioned in a top half of the inner volume, and into the cooling liquid circulating through a cooling liquid flow path;
    transferring heat from the plurality of wicking structures through a heat transfer layer positioned on a top surface of the housing and within the cooling liquid flow path and to the cooling liquid circulating through the cooling liquid flow path;
    circulating the flow of the cooling liquid from the inlet port through the cooling liquid flow path defined through the heat transfer member and formed on the top surface of the housing of the vapor chamber to transfer heat from the vaporized portion of the heat transfer fluid into the cooling liquid; and
    circulating the heated flow of the cooling liquid from the cooling liquid flow path to an outlet port of the heat transfer member.

11. The method of claim 10, further comprising transferring the heat from the plurality of data center electronic devices through a thermal interface material positioned between the plurality of data center electronic devices and a bottom surface of the housing of the vapor chamber.

12. The method of claim 10, wherein circulating the flow of the cooling liquid through the cooling liquid flow path defined through the heat transfer member comprises circulating the cooling liquid through a plurality of flow channels defined by a plurality of heat transfer surfaces enclosed within the cooling liquid flow path and formed on the top surface of the vapor chamber.

13. The method of claim 10, wherein receiving heat from the plurality of data center electronic devices into the heat transfer fluid enclosed within the housing of the vapor chamber to vaporize at least the portion of the heat transfer fluid comprises:
    receiving heat from the plurality of data center electronic devices into a plurality of portions of the heat transfer fluid enclosed within respective fluidly independent chambers within the housing of the vapor chamber.

14. The method of claim 13, wherein the portions of the heat transfer fluid vary in at least one of composition or amount.

15. The method of claim 13, wherein at least one of the fluidly independent chambers comprises a first volume, and at least another of the fluidly independent chambers comprises a second volume greater than the first volume.

16. The method of claim 15, further comprising:
    receiving heat from the heat generating processor device into the portion of the heat transfer fluid enclosed within the second volume in the another of the fluidly independent chambers; and
    receiving heat from one or more memory devices into the portion of the heat transfer fluid enclosed within the first volume in the at least one of the fluidly independent chambers.

17. The method of claim 10, further comprising transferring heat from the plurality of data center electronic devices, to a plurality of fins positioned in a bottom half of the inner volume, and into the heat transfer fluid.

18. The server tray package of claim 7, wherein the vapor chamber comprises a plurality of fins positioned in a bottom half of the inner volume.

19. The server tray package of claim 18, wherein the vapor chamber comprises a plurality of wicking structures positioned in a top half of the inner volume.

20. The method of claim 11, wherein circulating the flow of the cooling liquid through the cooling liquid flow path defined through the heat transfer member comprises circulating the cooling liquid through a plurality of flow channels defined by a plurality of heat transfer surfaces enclosed within the cooling liquid flow path and formed on the top surface of the vapor chamber.

21. The method of claim 20, wherein receiving heat from the plurality of data center electronic devices into the heat transfer fluid enclosed within the housing of the vapor chamber to vaporize at least the portion of the heat transfer fluid comprises:
    receiving heat from the plurality of data center electronic devices into a plurality of portions of the heat transfer fluid enclosed within respective fluidly independent chambers within the housing of the vapor chamber.

22. The method of claim 16, wherein the portions of the heat transfer fluid vary in at least one of composition or amount.

* * * * *